US012707878B2

(12) United States Patent
Yoon et al.

(10) Patent No.: US 12,707,878 B2
(45) Date of Patent: Aug. 11, 2026

(54) METHOD OF MANUFACTURING DISPLAY DEVICE

(71) Applicant: Samsung Display Co., LTD., Yongin-si (KR)

(72) Inventors: Heechang Yoon, Yongin-si (KR); Seungwook Kwon, Yongin-si (KR); Hyojeong Kwon, Yongin-si (KR); Seung-Yeon Chae, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 426 days.

(21) Appl. No.: 18/217,536

(22) Filed: Jul. 1, 2023

(65) Prior Publication Data

US 2024/0081138 A1 Mar. 7, 2024

(30) Foreign Application Priority Data

Sep. 7, 2022 (KR) ........................ 10-2022-0113758

(51) Int. Cl.

*H10K 59/12* (2023.01)
*H10K 59/80* (2023.01)
*H10K 71/80* (2023.01)

(52) U.S. Cl.

CPC ......... *H10K 71/80* (2023.02); *H10K 59/1201* (2023.02); *H10K 59/873* (2023.02)

(58) Field of Classification Search

CPC ............... H10K 59/1201; H10K 59/87; H10K 59/8722; H10K 59/873; H10K 71/80; H10K 50/844

See application file for complete search history.

(56) References Cited

U.S. PATENT DOCUMENTS

| | | | | |
|---|---|---|---|---|
| 10,800,936 | B2 | 10/2020 | Landa et al. | |
| 2005/0198794 | A1* | 9/2005 | Love | B24C 3/12 29/81.08 |
| 2015/0224740 | A1* | 8/2015 | Kim | B32B 27/32 264/131 |
| 2018/0067233 | A1* | 3/2018 | Chen | G02B 5/3041 |
| 2020/0119305 | A1* | 4/2020 | Kwon | H10K 71/40 |
| 2020/0311376 | A1* | 10/2020 | Kim | H01L 23/12 |
| 2021/0001612 | A1* | 1/2021 | Kamada | B32B 27/26 |
| 2021/0407888 | A1* | 12/2021 | Elsherbini | H01L 23/473 |
| 2024/0170771 | A1* | 5/2024 | Kawakita | H01M 50/131 |

FOREIGN PATENT DOCUMENTS

| | | | |
|---|---|---|---|
| KR | 101559112 | B1 | 10/2015 |
| KR | 1020160030017 | A | 3/2016 |
| KR | 1020200041408 | A | 4/2020 |

* cited by examiner

*Primary Examiner* — Eric K Ashbahian

(74) *Attorney, Agent, or Firm* — CANTOR COLBURN LLP

(57) ABSTRACT

A method of manufacturing a display device includes: forming an encapsulation layer on a display panel, forming an uncured resin layer on the encapsulation layer, applying beads on a surface of the uncured resin layer and forming a protective layer by curing the uncured resin layer.

19 Claims, 11 Drawing Sheets

METHOD OF MANUFACTURING DISPLAY DEVICE

This application claims priority to Korean Patent Application No. 10-2022-0113758, filed on Sep. 7, 2022, and all the benefits accruing therefrom under 35 U.S.C. § 119, the content of which in its entirety is herein incorporated by reference.

BACKGROUND

1. Field

Embodiments relate to a display device. More particularly, embodiments relate to a method of manufacturing the display device.

2. Description of the Related Art

The display device is a device that displays an image for providing visual information to a user. Among display devices, an organic light emitting diode display has attracted attention.

The organic light-emitting display device has a self-emission characteristic and does not require a separate light source, unlike a liquid crystal display device, so that the thickness and weight may be reduced. In addition, the organic light emitting diode display exhibits high quality characteristics such as low power consumption, high luminance, and high reaction speed.

During a process of manufacturing a display device, providing a protective layer for protecting the display panel and the encapsulation layer is desirable. The protective layer may be attached or formed on the display panel and the encapsulation layer. The protective layer is peeled off and removed from the display panel and the encapsulation layer after the manufacturing process is finished.

SUMMARY

Embodiments provide a method of manufacturing a display device capable of controlling peeling force of a protective layer.

A method of manufacturing a display device according to an embodiment includes: forming an encapsulation layer on a display panel, forming an uncured resin layer on the encapsulation layer, applying beads on a surface of the uncured resin layer, and forming a protective layer by curing the uncured resin layer.

In an embodiment, a total surface area formed by exposed portions of the beads and the surface of the uncured resin layer may be increased due to the beads.

In an embodiment, at least a portion of each of the beads may be exposed on the surface of the uncured resin layer.

In an embodiment, the beads may form concavo-convex shapes on the surface of the uncured resin layer to increase the total surface area.

In an embodiment, the beads may be applied to an edge portion of the uncured resin layer.

In an embodiment, each of the beads may include at least one of silicon (Si), alumina (AlOx), rubber, and metal.

In an embodiment, each of the beads may have a spherical or polygonal structure.

In an embodiment, a diameter of each of the beads may be in a range of about 5 micrometers to about 80 micrometers.

In an embodiment, the method may further include peeling off the protective layer using a peeling tape.

In an embodiment, the peeling tape may be attached to a surface of the protective layer on which the beads are applied.

In an embodiment, the peeling tape may be attached to an edge portion of the protective layer.

In an embodiment, a peeling force between the peeling tape and the protective layer may be controlled according to the total number of the beads.

In an embodiment, the peeling force between the peeling tape and the protective layer may increase as the total number of the beads increases.

In an embodiment, a peeling force between the peeling tape and the protective layer may be controlled according to a diameter of each of the beads.

In an embodiment, the peeling force between the peeling tape and the protective layer may increase as the diameter of each of the beads increases.

In an embodiment, the protective layer may include the surface exposed to an outside and a bottom surface contacting a surface of the encapsulation layer, and an end of the surface exposed to the outside and an end of the bottom surface may be connected to each other.

In an embodiment, a length between the surface exposed to the outside and the bottom surface in a thickness direction may decrease toward an end of the protective layer.

In an embodiment, the forming of the uncured resin layer may be performed by an inkjet method.

In an embodiment, the applying of the beads may include injecting air, injecting the beads, mixing the air with the beads and discharging the air and the beads.

In an embodiment, the display panel may be formed on a carrier substrate, and an angle between a major surface of the carrier substrate and a direction in which the beads are discharged may be in a range of about 45 degrees to about 135 degrees.

In a display device according to embodiments of the present disclosure, as the beads are applied on the uncured resin layer to increase the total surface area formed by exposed portions of the beads and the surface of the uncured resin layer, contact area between the peeling tape and the protective layer may increase. Accordingly, the peeling force between the peeling tape and the protective layer may increase. Thus, the protective layer may be easily removed from the display device. Also, by controlling the number of beads and the size of the diameter of the beads, the peeling force may be adjusted. Accordingly, efficiency in the manufacturing process of the display device may be effectively increased.

By applying the beads on the protective layer, damage such as tearing of the protective layer may be prevented. Therefore, durability of the protective layer may be improved due to the beads.

DETAILED DESCRIPTION

Figure 1:
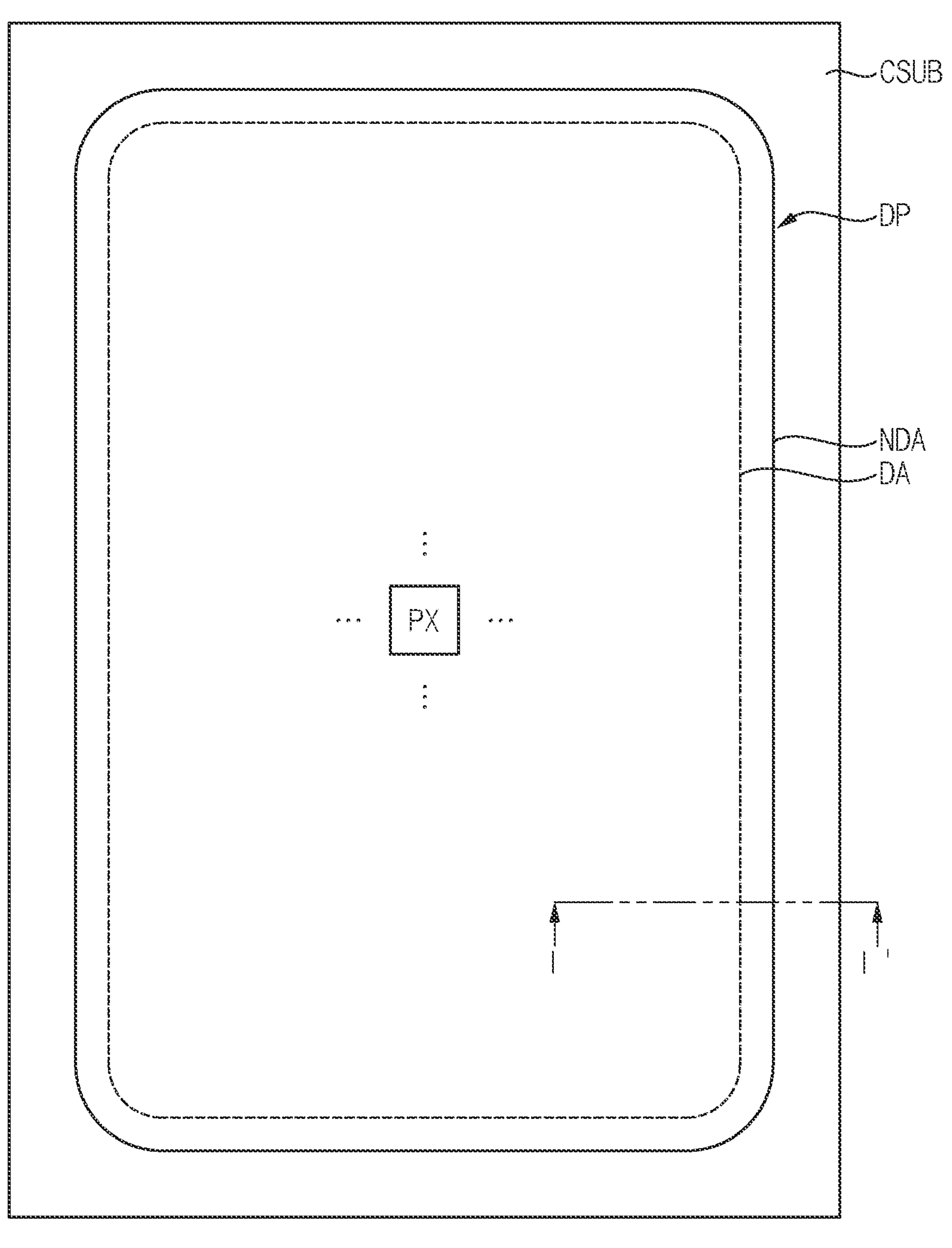
FIG. 1 is a plan view illustrating a method of manufacturing a display device according to the present disclosure.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, display devices in accordance with embodiments will be described in more detail with reference to the accompanying drawings. The same reference numerals are used for the same components in the drawings, and redundant descriptions of the same components will be omitted.

FIGS. 1 to 14 are views for explaining a method of manufacturing a display device.

Figure 2:
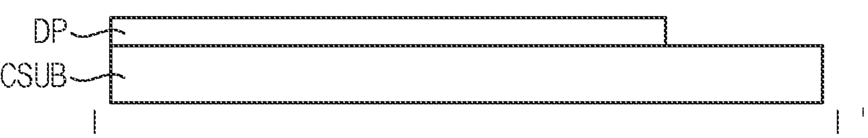
FIG. 2 is a cross-sectional view taken along line I-I' of FIG. 1.
Figure 3:
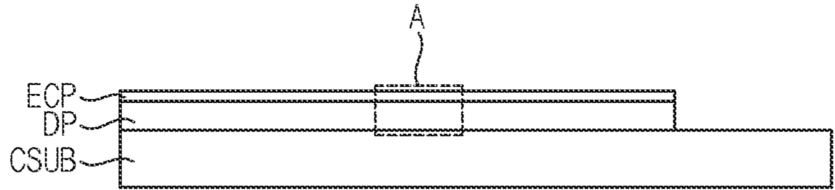
FIG. 3 is a cross-sectional view illustrating a method of manufacturing a display device according to the present disclosure.

For example, FIG. 1 is a plan view illustrating a method of manufacturing a display device according to the present disclosure, FIG. 2 is a cross-sectional view taken along line I-I' of FIG. 1, and FIG. 3 is a cross-sectional view illustrating a method of manufacturing a display device according to the present disclosure.

Referring to FIGS. 1 and 2, a carrier substrate CSUB may be prepared. The carrier substrate CSUB may be formed of a rigid material. For example, the carrier substrate CSUB may be formed of glass. However, the present disclosure is not limited thereto.

A display panel DP may be formed on the carrier substrate CSUB. The display panel DP may include a display area DA and a non-display area NDA. The display area DA may be an area displaying an image. The planar shape of the display area DA may be a rectangular shape or a rectangular shape with rounded corners. However, the planar shape of the display area DA is not limited thereto, and the display area DA may have various planar shapes such as a circular shape, an elliptical shape, and a polygonal shape.

The non-display area NDA may be disposed around the display area DA. The non-display area NDA may surround the display area DA. The non-display area NDA may be an area not displaying an image. In an embodiment, drivers for displaying an image of the display area DA may be disposed in the non-display area NDA.

Pixels PX may be arranged in a matrix in the display area DA. Signal lines such as a gate line and a data line may be disposed in the display area DA. The signal lines such as the gate line and the data line may be connected to each of the pixels PX. Each of the pixels PX may receive a gate signal, a data signal, and the like from the signal line.

Further referring to FIG. 3, an encapsulation layer ECP may be formed on the display panel DP. The encapsulation layer ECP may cover the display panel DP.

Figure 4:
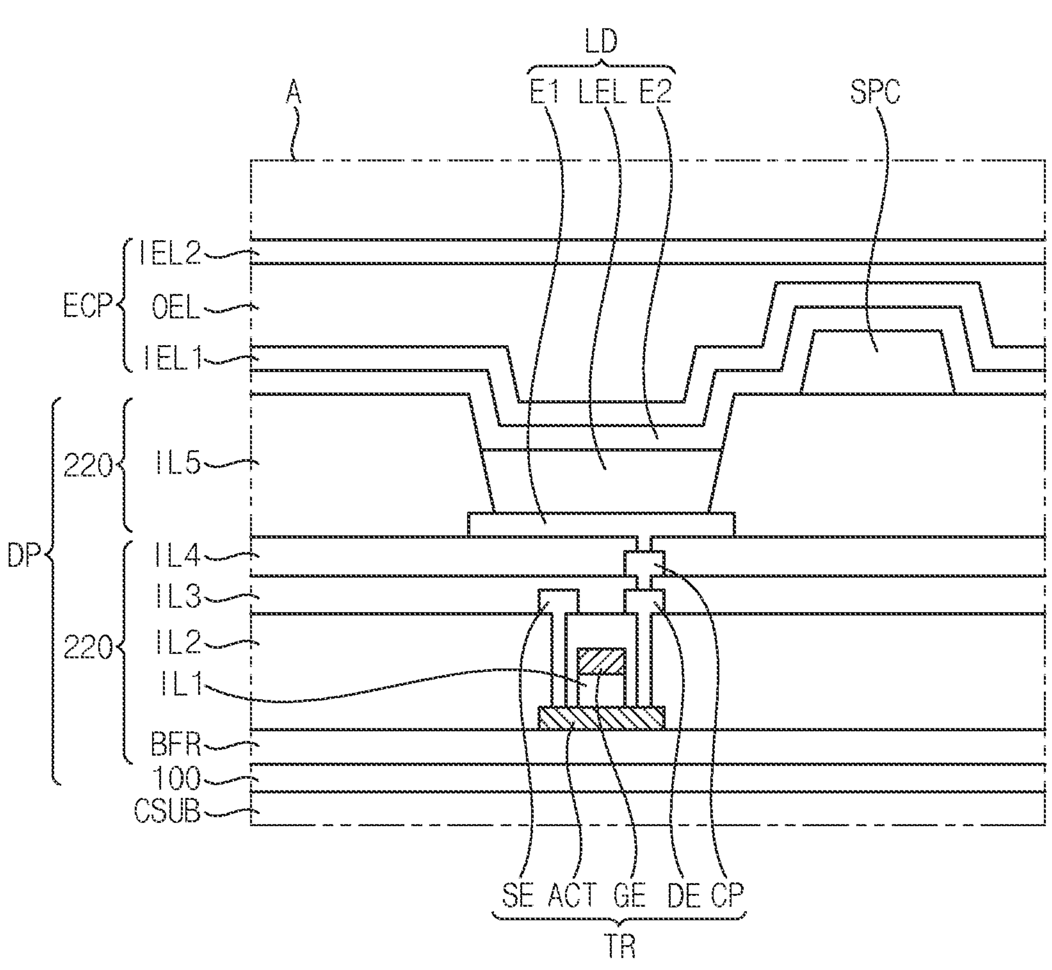
FIG. 4 is an enlarged cross-sectional view of area A of FIG. 3.

FIG. 4 is an enlarged cross-sectional view of area A of FIG. 3.

Referring further to FIG. 4, the display panel DP may include a substrate 100, a circuit element layer 210 and a light emitting element layer 220. The encapsulation layer ECP may be formed on the display panel DP.

The substrate 100 may be formed on the carrier substrate CSUB. The substrate 100 may be formed of a transparent or opaque material. The substrate 100 may include glass, quartz, plastic, or the like.

The circuit element layer 210 may be formed on the substrate 100. The circuit element layer 210 may include insulation layers and conductive layers. The light emitting element layer 220 may be formed on the circuit element layer 210. The light emitting element layer 220 may include a fifth insulation layer IL5 and a light emitting diode LD. The light emitting element layer 220 may emit light, and the circuit element layer 210 may drive the light emitting element layer 220.

The circuit element layer 210 may include a buffer layer BFR, at least one transistor TR, a connection electrode CP, a first insulation layer ILL a second insulation layer IL2, and a third insulation layer IL3, and a fourth insulation layer IL4. The transistor TR may include an active layer ACT, a gate electrode GE, a source electrode SE, and a drain electrode DE.

The light emitting element layer 220 may include a fifth insulation layer IL5, a spacer SPC, and a light emitting diode LD. The light emitting diode LD may include a first electrode E1, a light emitting layer LEL, and a second electrode E2.

The buffer layer BFR may be formed on the substrate 100. The buffer layer BFR may prevent diffusion of metal atoms or impurities from the substrate 100 into the active layer ACT.

The active layer ACT may be formed on the substrate 100. The active layer ACT may be divided into a source region and a drain region doped with impurities and a channel region between the source region and the drain region.

The first insulation layer IL1 may be formed on the active layer ACT. The first insulation layer IL1 may have an island shape. The first insulation layer IL1 may overlap the active layer ACT and the gate electrode GE in a plan view and insulate the active layer ACT and the gate electrode GE. However, the present disclosure is not limited thereto.

For example, the first insulation layer IL1 may include an inorganic material.

The gate electrode GE may be formed on the first insulation layer IL1. In an embodiment, the gate electrode GE may overlap the channel region of the active layer ACT in a plan view.

The second insulation layer IL2 may be formed on the buffer layer BFR. In addition, the second insulation layer IL2 may cover the active layer ACT, the first insulation layer ILL and the gate electrode GE, and have substantially the same thickness along the profile of the active layer ACT, the first insulation layer ILL and the gate electrode GE. However, the present disclosure is not limited thereto.

The source electrode SE and the drain electrode DE may be formed on the second insulation layer IL2. The source electrode SE may contact the source region of the active layer ACT through a first contact hole formed in the second insulation layer IL2. The drain electrode DE may contact the drain region of the active layer ACT through a second contact hole formed in the second insulation layer IL2.

The third insulation layer IL3 may be formed on the second insulation layer IL2. In addition, the third insulation layer IL3 may cover the source and drain electrodes SE and DE, and have a substantially flat top surface without creating a step around the source and drain electrodes SE and DE. For example, the third insulation layer IL3 may be formed of an organic material.

The connection electrode CP may be formed on the third insulation layer IL3. The connection electrode CP may contact the source electrode SE or the drain electrode DE through a second contact hole formed in the third insulation layer IL3.

The fourth insulation layer IL4 may be formed on the third insulation layer IL3. Also, the fourth insulation layer IL4 may cover the connection electrode CP and have a substantially flat top surface without creating a step around the source and drain electrodes SE and DE. For example, the fourth insulation layer IL4 may be formed of an organic material.

The first electrode E1 may be formed on the fourth insulation layer IL4. The first electrode E1 may have reflective or light-transmitting properties. For example, the first electrode E1 may be formed of metal.

The first electrode E1 may contact the connection electrode CP through a third contact hole formed in the fourth insulation layer IL4. Through this, the first electrode E1 may be connected to the transistor TR.

The fifth insulation layer IL5 may be formed on the fourth insulation layer IL4. An opening exposing an upper surface of the first electrode E1 may be formed in the fifth insulation layer IL5. For example, the fifth insulation layer IL5 may be formed of an organic material or an inorganic material.

The spacer SPC may be formed on the fifth insulation layer IL5. For example, the spacer SPC may be formed of an organic material or an inorganic material. The spacer SPC may maintain a gap between the encapsulation layer ECP and the substrate 100.

The spacer SPC may be formed of a material different from a material of the fifth insulation layer IL5. The spacer SPC may be formed after the fifth insulation layer IL5 is formed. However, embodiments according to the present disclosure are not limited thereto, and the spacer SPC may include the same material as the fifth insulation layer IL5 in another embodiment. For example, the fifth insulation layer IL5 and the spacer SPC may be formed of an organic material such as polyimide. Also, the fifth insulation layer IL5 and the spacer SPC may be simultaneously formed using a halftone mask.

The light emitting layer LEL may be formed on the first electrode E1. The light emitting layer LEL may be formed in the opening formed in the fifth insulation layer IL5. In an embodiment, the light emitting layer LEL may have a multilayer structure including a hole injection layer, a hole transport layer, an organic light emitting layer, an electron transport layer, and an electron injection layer. The organic light emitting layer may be formed of a light emitting material.

The second electrode E2 may cover the light emitting layer LEL and be formed on the fifth insulation layer IL5 and the spacer SPC. In an embodiment, the second electrode E2 may have a plate shape. In addition, the second electrode E2 may have light transmitting or reflecting properties. For example, the second electrode E2 may be formed of metal.

The encapsulation layer ECP may prevent penetration of moisture and oxygen into the light emitting diode LD from the outside. For example, the encapsulation layer ECP may include a first inorganic encapsulation layer IEL1, an organic encapsulation layer OEL, and a second inorganic encapsulation layer IEL2.

The first inorganic encapsulation layer IEL1 may be formed with substantially the same thickness on the second electrode E2 along the profile of the second electrode E2. The organic encapsulation layer OEL may be formed on the first inorganic encapsulation layer IEL1, and have a substantially flat top surface without creating a step around the first inorganic encapsulation layer TELL The second inorganic encapsulation layer IEL2 may be formed on the organic encapsulation layer OEL.

Figure 5:
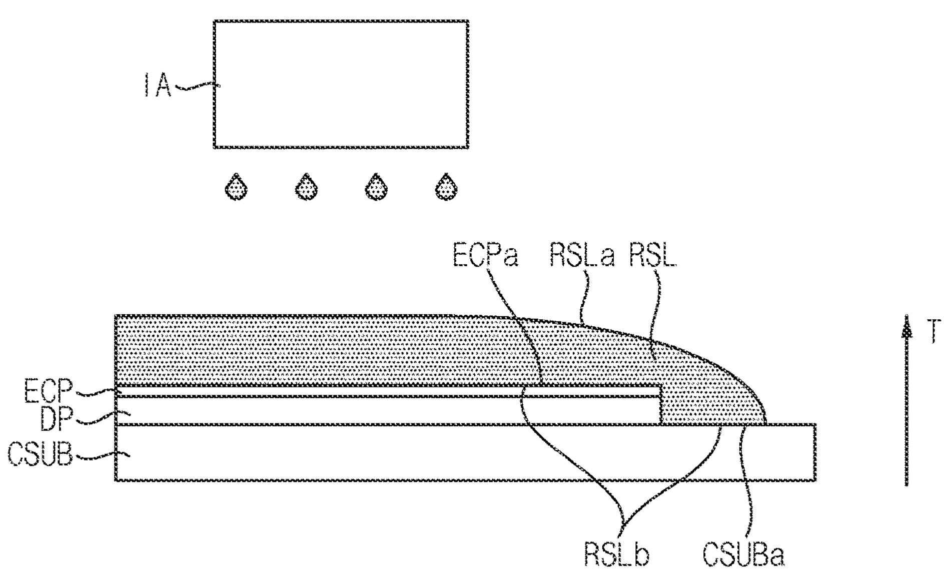
FIG. 5 is a cross-sectional view illustrating a method of manufacturing a display device according to the present disclosure.

FIG. 5 is a cross-sectional view illustrating a method of manufacturing a display device according to the present disclosure.

Referring further to FIG. 5, In an embodiment, an uncured resin layer RSL may be formed on the encapsulation layer ECP. The uncured resin layer RSL may be formed by an inkjet method. Accordingly, the uncured resin layer RSL may be formed by applying ink on the encapsulation layer ECP by the inkjet device IA. For example, the inkjet device IA may be an inkjet head that applies the ink. The ink may include a photocurable resin. The photocurable resin may be a material whose hardness is increased by being cured by ultraviolet light or the like. The ink may further include an initiator that generates free radicals or ions when stimulated by ultraviolet light or the like.

The uncured resin layer RSL may be formed by printing once or several times with the inkjet device IA. For example, the uncured resin layer RSL may have a thickness in a range of about 10 micrometers to about 150 micrometers. The uncured resin layer RSL may become thicker as the inkjet device IA prints several times. As used herein, the thickness is measured in a thickness direction T (See FIGS. 5 and 11) of the display panel DP, the thickness direction T is a normal direction to a major surface of the display panel DP, and the "plan view" is a view in the thickness direction T.

The uncured resin layer RSL may cover the encapsulation layer ECP and the display panel DP. That is, the uncured resin layer RSL may protect the encapsulation layer ECP and the display panel DP without exposing the encapsulation layer ECP and the display panel DP. Also, the uncured resin layer RSL may partially overlap the carrier substrate CSUB in a plan view. However, the present disclosure is not limited thereto.

The uncured resin layer RSL may include a surface RSLa and a bottom surface RSLb. The surface RSLa may be a surface exposed to the outside. The bottom surface RSLb may contact a surface ECPa of the encapsulation layer ECP. In addition, as the uncured resin layer RSL partially overlaps the carrier substrate CSUB in a plan view, the bottom surface RSLb may also contact the surface CSUBa of the carrier substrate CSUB.

Figure 6:
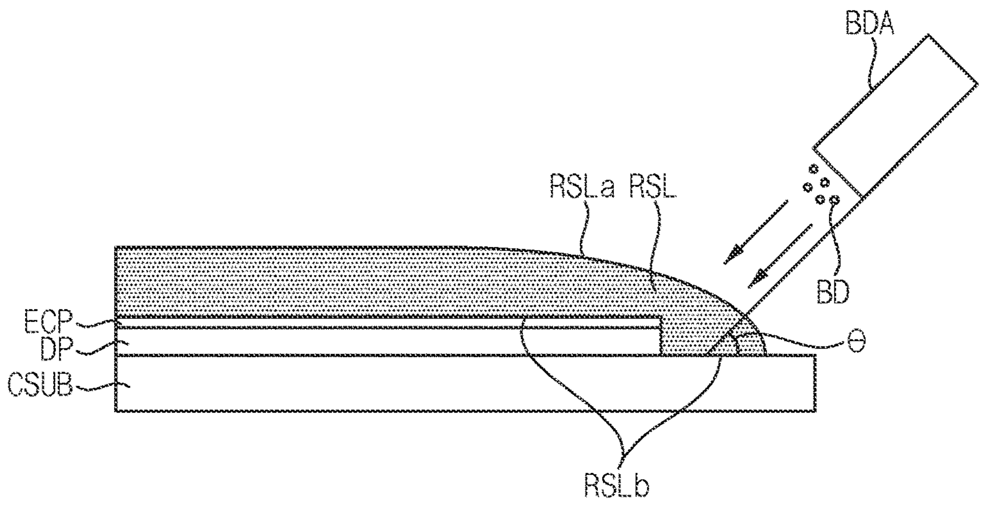
FIG. 6 is a cross-sectional view illustrating a method of manufacturing a display device according to the present disclosure.
Figure 7:
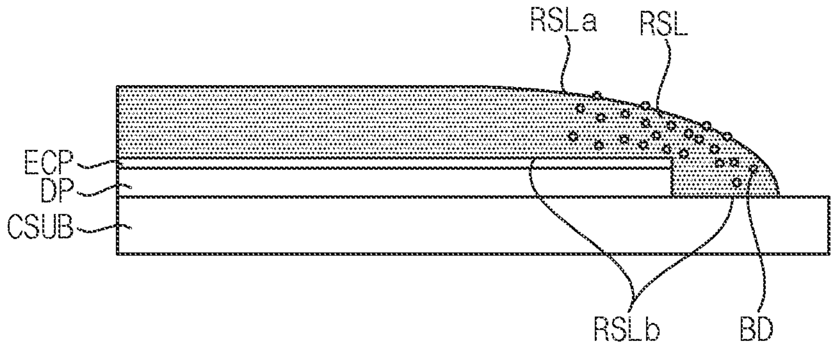
FIG. 7 is a cross-sectional view illustrating a method of manufacturing a display device according to the present disclosure.

FIGS. 6 and 7 are cross-sectional views illustrating a method of manufacturing a display device according to the present disclosure.

Referring to FIGS. 6 and 7, beads BD may be applied on the surface RSLa of the uncured resin layer RSL. The beads BD may be applied to an edge portion of the uncured resin layer RSL. For example, a bead discharge device BDA may discharge the beads BD and apply the beads BD on the surface RSLa of the uncured resin layer RSL.

The beads BD may be embedded in the surface RSLa of the uncured resin layer RSL. Accordingly, at least a portion of each of the beads BD may be exposed on the surface RSLa of the uncured resin layer RSL. However, the present disclosure is not limited thereto, and the beads BD may also be disposed inside the uncured resin layer RSL in another embodiment.

Accordingly, the beads BD may form concavo-convex shape with the uncured resin layer RSL on the surface RSLa of the uncured resin layer RSL so that a total surface area formed by exposed portions of the beads BD and the surface RSLa of the uncured resin layer RSL is increased. Due to the beads BD, the surface RSLa of the uncured resin layer RSL may have the concavo-convex shape. Therefore, the total surface area may be increased due to the beads BD.

Figure 8:
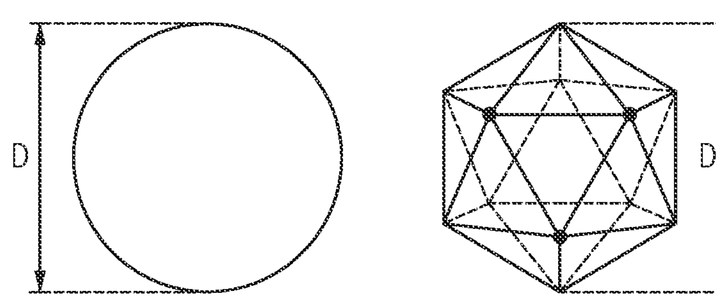
FIG. 8 is a front view illustrating shapes of each of the beads of FIG. 6.

FIG. 8 is a front view illustrating shapes of each of the beads of FIG. 6.

Further referring to FIG. 8, each of the beads BD may have a spherical or polygonal structure. For example, as shown in the drawing, each of the beads BD may have a spherical or icosahedral structure. However, the present disclosure is not limited thereto, and the polygonal structure is not limited to the icosahedral structure.

In an embodiment, the diameter D of each of the beads BD may be in a range of about 5 micrometers to about 80 micrometers. When the diameter D of each of the beads BD is smaller than about 5 micrometers, the beads BD may be aggregated with each other. When the beads BD are aggregated together, the beads BD may not be uniformly coated on the surface RSLa of the uncured resin layer RSL. Therefore, it may be difficult to control the beads BD.

In addition, when the diameter D of each of the beads BD is greater than about 80 micrometers, the diameter D of each of the beads BD may be similar to the height of the uncured resin layer RSL. Accordingly, surface roughness of the protective layer PL after the uncured resin layer RSL is cured may increase. In addition, when the diameter D of each of the beads BD is greater than about 80 micrometers, the formation of the protective layer PL may be hindered by the beads BD.

In an embodiment, each of the beads BD may include at least one of silicon (Si), alumina (AlOx), rubber, and metal. Specifically, examples of materials constituting the beads may include BD, $SiO_2$, $Al_2O_3$, $Ga_2O_3$, $GeO_2$, $SnO_2$, ZnO, CuO, NiO, MnOx, $ZrO_2$, $In_2O_3$, $Sb_2O_3$, AgO. $BaSO_4$, $CaCO_3$, etc.

Figure 9:
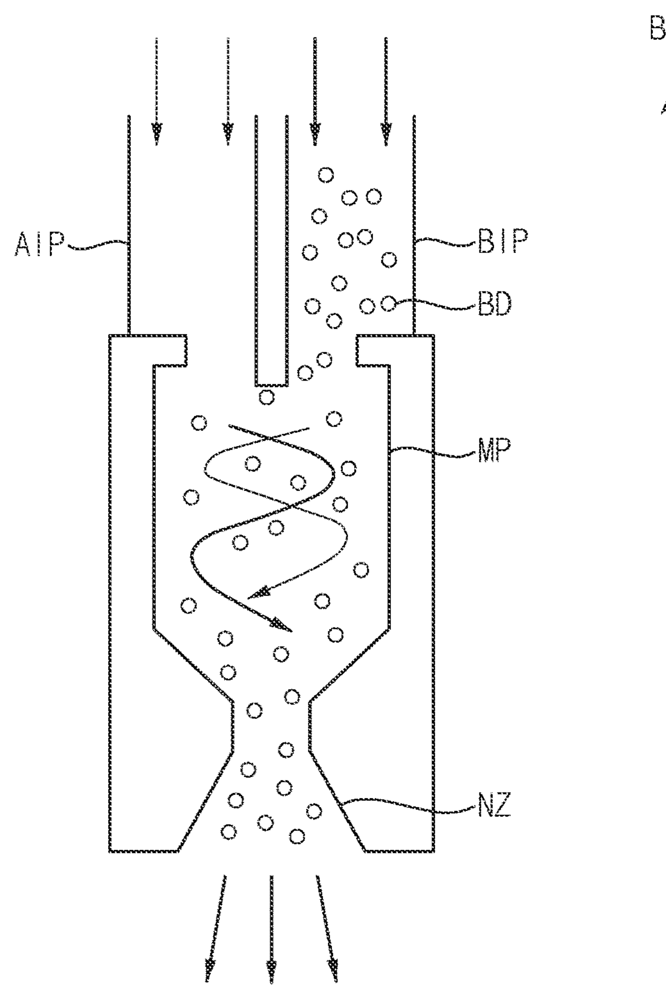
FIG. 9 is an enlarged cross-sectional view of a bead discharge device of FIG. 6.

FIG. 9 is an enlarged cross-sectional view of a bead discharge device of FIG. 6.

Referring further to FIG. 9, the bead discharge device BDA may apply the beads BD. The bead discharge device BDA may inject air. The bead discharging device BDA may inject the beads BD. The injected air and the beads BD may be mixed with each other. The bead discharge device BDA may discharge the mixed air and the beads BD.

Specifically, the bead discharge device BDA may include an air injection part AIP, a bead injection part BIP, a mixing part MP, and a discharge part NZ. For example, the air injection part AIP may inject air. The bead injection part BIP may inject the beads BD. The mixing part MP may mix the injected air with the beads BD. The discharge part NZ may be a discharge nozzle, and discharge the mixed air and the beads BD. As the beads BD are mixed with air and discharged, the beads BD may be uniformly discharged. Since the beads BD are uniformly discharged, the beads BD may be uniformly applied on the surface RSLa of the uncured resin layer RSL.

Referring to FIGS. 6 and 9, the beads BD may be discharged at an angle in a range of about 45 degrees to about 135 degrees with respect to a major surface of the carrier substrate CSUB. For example, an inclined angle θ of the bead discharge device BDA with respect to the major surface of the carrier substrate CSUB may be in a range of about 45 degrees to about 135 degrees. Accordingly, an angle θ between the major surface of the carrier substrate CSUB and the direction in which the beads BD are discharged may be in a range of about 45 degrees to about 135 degrees.

When the angle θ between the major surface of the carrier substrate CSUB and the direction in which the beads BD are discharged is less than about 45 degrees or greater than about 135 degrees, it may be difficult to apply the beads BD on the surface RSLa of the uncured resin layer RSL due to the direction in which the beads BD are discharged.

Since the edge portion of the uncured resin layer RSL has an inclined surface, when the discharge angle θ of the beads BD is less than about 45 degrees, it may be difficult to apply the beads BD uniformly on the edge portion in which the inclined surface is located. Accordingly, when the beads BD are applied, process efficiency may decrease.

In addition, when the beads BD are discharged, the beads BD may bounce off the surface RSLa of the uncured resin layer RSL while colliding with each other. In this case, when the discharge angle θ of the beads BD is less than about 90 degrees, the beads BD may be disposed at a middle portion of the uncured resin layer RSL, not at an edge portion, while bouncing off. When the discharge angle θ of the beads BD is in a range of about 90 degrees to about 135 degrees, even if the beads BD collide with each other and bounce off, the beads BD may bounce out of the carrier substrate CSUB.

However, when the discharge angle θ of the beads BD is greater than about 135 degrees, the beads BD may be applied not on the surface RSLa of the uncured resin layer RSL, but on the carrier substrate CSUB. Therefore, it may be difficult to easily arrange the beads BD on the surface RSLa of the uncured resin layer RSL. Therefore, process efficiency may decrease when the beads BD are applied.

Figure 10:
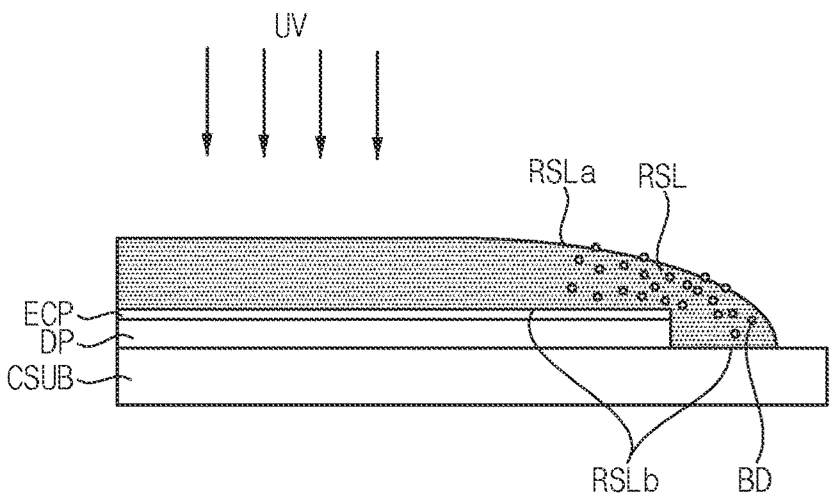
FIG. 10 is a cross-sectional view illustrating a method of manufacturing a display device according to the present disclosure.
Figure 11:
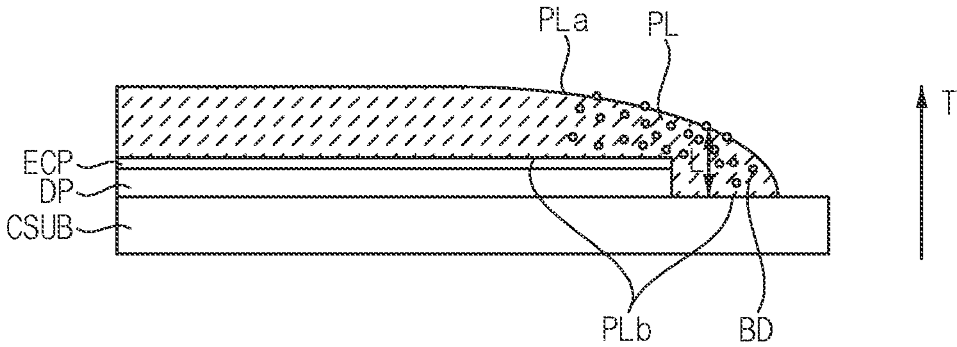
FIG. 11 is a cross-sectional view illustrating a method of manufacturing a display device according to the present disclosure.

FIGS. 10 and 11 are a cross-sectional views illustrating a method of manufacturing a display device according to the present disclosure.

Further referring to FIGS. 10 and 11, ultraviolet light may be irradiated to the uncured resin layer RSL. The uncured resin layer RSL may be cured by the ultraviolet light to form a protective layer PL. That is, the protective layer PL may be in a state in which the uncured resin layer RSL is cured. The protective layer PL may include an organic material.

As the uncured resin layer RSL includes the surface RSLa and the bottom surface RSLb, the protective layer PL may also include a surface PLa and a bottom surface PLb. The surface PLa of the protective layer PL may be exposed to the outside, and the bottom surface PLb may contact the surface of the encapsulation layer ECP. In addition, an end of the surface PLa and an end of the bottom surface PLb of the protective layer PL may be connected to each other. Accordingly, a length L (i.e., thickness) between the surface PLa and the bottom surface PLb may decrease toward the an end of the protective layer.

A polymer network may be formed when the uncured resin layer RSL is cured. The photocurable resin included in the ink may react with ultraviolet light to form the polymer network. Thus, the protective layer PL may include the polymer network.

Figure 12:
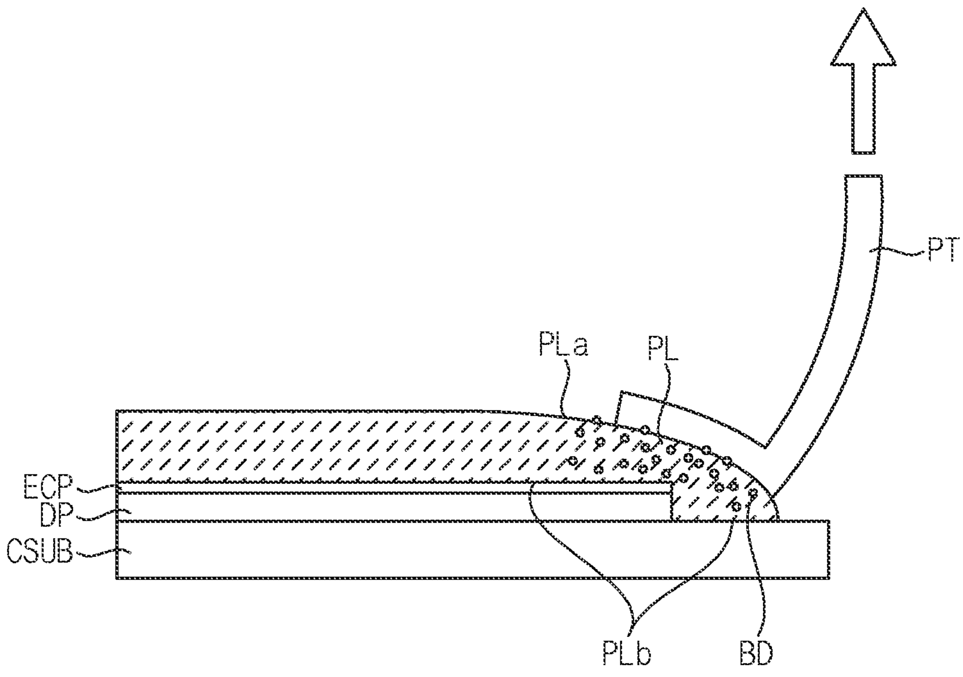
FIG. 12 is a cross-sectional view illustrating a method of manufacturing a display device according to the present disclosure.
Figure 13:
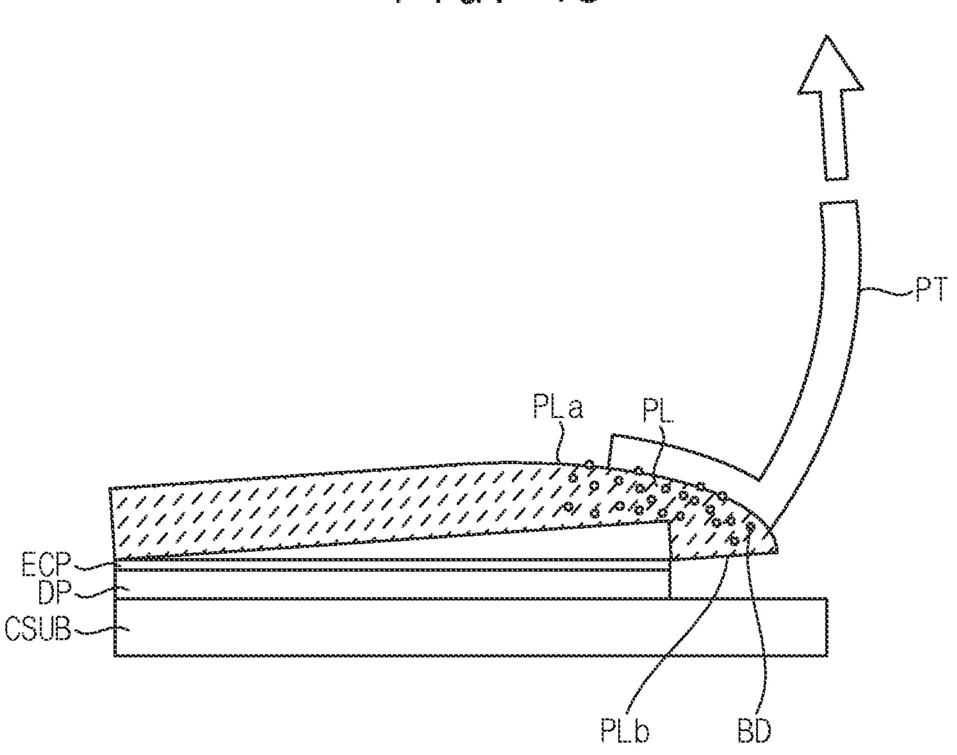
FIG. 13 is a cross-sectional view illustrating a method of manufacturing a display device according to the present disclosure.
Figure 14:
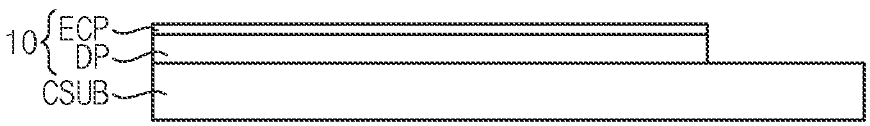
FIG. 14 is a cross-sectional view illustrating a method of manufacturing a display device according to the present disclosure.

FIGS. 12 to 14 are a cross-sectional views illustrating a method of manufacturing a display device according to the present disclosure.

Referring to FIGS. 12 to 14, the protective layer PL may be peeled off from the encapsulation layer ECP and the display panel DP. That is, the protective layer PL may be removed from the encapsulation layer ECP and the display panel DP. The protective layer PL may be a layer that protects the encapsulation layer ECP and the display panel DP in a manufacturing process. Therefore, the protective layer PL may be peeled off from the encapsulation layer ECP and the display panel DP after the manufacturing process is finished. Through this, the display device 10 including the encapsulation layer ECP and the display panel DP may be formed.

Specifically, the protective layer PL may be peeled off using a peeling tape PT. The peeling tape PT may be attached to the surface PLa of the protective layer PL. The peeling tape PT may be attached to the surface PLa of the protective layer PL to which the beads BD are applied. That is, the peeling tape PT may be attached to an edge portion of the protective layer PL.

The peeling tape PT may lift an attached portion of the edge portion of the protective layer PL. Accordingly, the peeling tape PT may peel off the protective layer PL from the display panel DP, the encapsulation layer ECP, and the carrier substrate CSUB.

In an embodiment, the total surface area formed by exposed portions of the beads BD and the edge portion of the protective layer PL may be increased due to the beads BD. Therefore, as the beads BD increase the total surface area, an attachment area between the peeling tape PT and the surface PLa of the protective layer PL may increase. Accordingly, peeling force between the peeling tape PT and the protective layer PL may increase. The peeling force may represent the degree of force applied when a member is peeled from another member.

In an embodiment, the peeling force between the peeling tape PT and the protective layer PL may be controlled according to the number of beads BD. Specifically, the peeling force between the peeling tape PT and the protective layer PL may increase as the number of beads BD increases. This may be because the total surface area formed by exposed portions of the beads BD and the surface PLa of the protective layer PL increases as the number of beads BD increases.

Also, the peeling force between the peeling tape PT and the protective layer PL may be controlled according to a diameter of each of the beads BD. Specifically, the peeling force between the peeling tape PT and the protective layer PL may increase as the diameter of each of the beads BD increases. This may be because the total surface area formed by exposed portions of the beads BD and the surface PLa of the protective layer PL increases as the diameter of each of the beads BD increases.

In an embodiment, as the beads BD are applied on the uncured resin layer RSL to increase the total surface area formed by exposed portions of the beads BD and the surface RSLa of the uncured resin layer RSL, the peeling force between the peeling tape PT and the protective layer PL may increase. Therefore, the protective layer PL may be easily removed from the display device 10. In addition, the peeling force may be adjusted by controlling the number and diameter of the beads BD. Thus, efficiency in the manufacturing process of the display device 10 may be increased.

In addition, since the beads BD are applied on the protective layer PL, damage such as tearing of the protective layer PL may be prevented. Accordingly, durability of the protective layer PL may be improved due to the beads BD.

Figure 15:
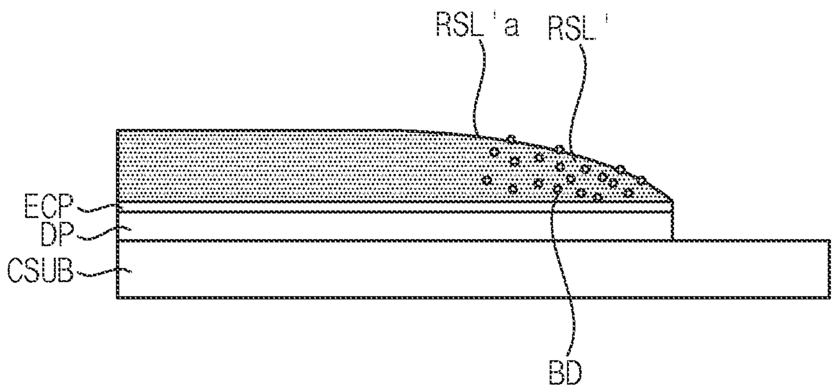
FIG. 15 is a view illustrating another embodiment of FIG. 7.

FIG. 15 is a view illustrating another embodiment of FIG. 7.

Referring to FIG. 15, an uncured resin layer RSL' may be formed only on the encapsulation layer ECP. That is, the uncured resin layer RSL' may not be formed directly on the carrier substrate CSUB, but may be formed spaced apart from the carrier substrate CSUB. However, the present disclosure is not limited thereto.

At this time, beads BD may be applied on the surface RSL'a of the uncured resin layer RSL'. The beads BD may increase a total surface area formed by exposed portions of the beads BD and the surface RSL'a of the uncured resin layer RSL'. After the protective layer is formed by curing the uncured resin layer RSL', the protective layer may be easily peeled off by lifting the edge portion of the protective layer to which the beads BD are applied.

Figure 16:
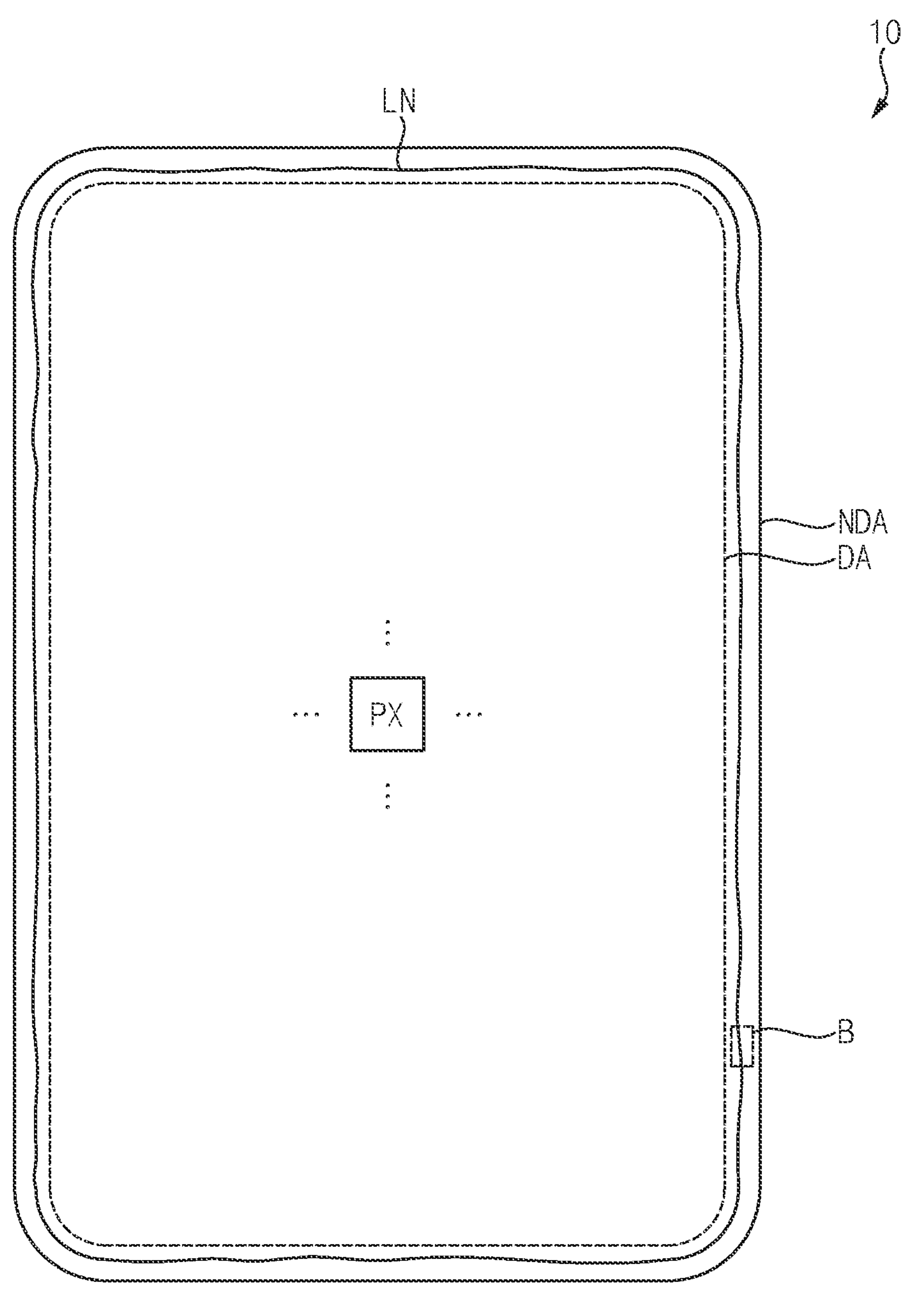
FIG. 16 is a plan view illustrating a display device according to an embodiment of the present disclosure.
Figure 17:
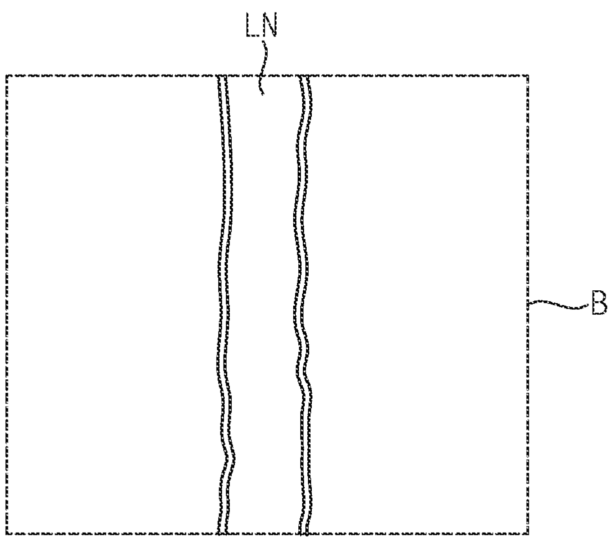
FIG. 17 is an enlarged plan view of area B of FIG. 16.

FIG. 16 is a plan view illustrating a display device according to an embodiment of the present disclosure. FIG. 17 is an enlarged plan view of area B of FIG. 16.

For example, the display device 10 of FIG. 16 may be a display device manufactured according to the method of manufacturing the display device according to FIGS. 1 to 14. Also, the display device 10 of FIG. 16 may have a planar shape of the display device 10 of FIG. 14. Therefore, redundant descriptions may be omitted.

Referring to FIGS. 1, 16, and 17, the display device 10 may include an encapsulation layer (e.g., the encapsulation layer ECP of FIG. 3) and a display panel (e.g., the display panel DP of FIG. 3).

When the protective layer (for example, the protective layer PL of FIG. 11) is peeled off from the display device 10, a stain line LN may be formed at a location where the protective layer was formed due to a coffee ring phenomenon. That is, since the protective layer is formed by the inkjet method, the coffee ring phenomenon may occur when the ink is discharged onto the display device 10 and then dried.

Specifically, in general, liquid may be dried from an edge. The liquid located inside may flow to the edge portion by capillary flow. That is, the liquid may maintain its spherical shape by surface tension. If the edge portion of the liquid evaporates first, the existing shape may be maintained while the liquid inside flows to the edge.

For example, when a liquid having a predetermined color is discharged to a specific object, solutes that have migrated inside the liquid may accumulate at the edge. And, as the liquid continues to evaporate, the solute may continue to accumulate. Therefore, when all of the discharged liquid is dried, the edge portion may have a darker color than a central portion.

Therefore, during the manufacturing process, the stain line LN may be visually recognized near the edge portion of the protective layer at the position where the protective layer is formed.

For example, the stain line LN may be formed in the non-display area NDA. Accordingly, the stain line LN may not be viewed in the display area DA. However, the present disclosure is not limited thereto, and the stain line LN may be formed in the display area DA in another embodiment.

Also, in the process of peeling off the protective layer, the material of the protective layer may remain on the display device 10. That is, since the protective layer includes an organic material, a portion of the protective layer remains on the display device 10 so that the organic material may be partially measured on the display device 10.

The methods according to the embodiments may be applied to a display device included in a computer, a notebook, a mobile phone, a smartphone, a smart pad, a PMP, a PDA, an MP3 player, or the like.

Although the methods according to the embodiments have been described with reference to the drawings, the illustrated embodiments are examples, and may be modified and changed by a person having ordinary knowledge in the relevant technical field without departing from the technical spirit described in the following claims.

What is claimed is:

1. A method of manufacturing a display device, the method comprising:
- forming an encapsulation layer on a display panel;
- forming an uncured resin layer on the encapsulation layer;
- applying beads on a surface of the uncured resin layer; and
- forming a protective layer by curing the uncured resin layer,
- wherein the uncured resin layer includes a central portion and an edge portion surrounding the central portion, and the beads are applied on the edge portion and not applied on the central portion.

2. The method of claim 1, wherein a total surface area formed by exposed portions of the beads and the surface of the uncured resin layer is increased due to the beads.

3. The method of claim 1, wherein at least a portion of each of the beads is exposed on the surface of the uncured resin layer.

4. The method of claim 2, wherein the beads form concavo-convex shapes on the surface of the uncured resin layer to increase the total surface area.

5. The method of claim 1, wherein each of the beads includes at least one of silicon (Si), alumina (AlOx), rubber, and metal.

6. The method of claim 1, wherein each of the beads has a spherical or polygonal structure.

7. The method of claim 1, wherein a diameter of each of the beads is in a range of about 5 micrometers to about 80 micrometers.

8. The method of claim 1, further comprising:
- peeling off the protective layer using a peeling tape.

9. The method of claim 8, wherein the peeling tape is attached to a surface of the protective layer on which the beads are applied.

10. The method of claim 8, wherein the peeling tape is attached to the edge portion of the protective layer.

11. The method of claim 8, wherein a peeling force between the peeling tape and the protective layer is controlled according to a total number of the beads.

12. The method of claim 11, wherein the peeling force between the peeling tape and the protective layer increases as the total number of the beads increases.

13. The method of claim 8, wherein a peeling force between the peeling tape and the protective layer is controlled according to a diameter of each of the beads.

14. The method of claim 13, wherein the peeling force between the peeling tape and the protective layer increases as the diameter of each of the beads increases.

15. The method of claim 1, wherein the protective layer includes the surface exposed to an outside and a bottom surface contacting a surface of the encapsulation layer, and
- an end of the surface exposed to the outside and an end of the bottom surface are connected to each other.

16. The method of claim 15, wherein a length between the surface exposed to the outside and the bottom surface in a thickness direction decreases toward an end of the protective layer.

17. The method of claim 1, wherein the forming of the uncured resin layer is performed by an inkjet method.

18. The method of claim 1, wherein the applying of the beads includes,
- injecting air;
- injecting the beads;
- mixing the air with the beads; and
- discharging the air and the beads.

19. The method of claim 1, wherein the display panel is formed on a carrier substrate, and
- an angle between a major surface of the carrier substrate and a direction in which the beads are discharged is in a range of about 45 degrees to about 135 degrees.

* * * * *